(12) United States Patent
Yan

(10) Patent No.: US 12,471,417 B2
(45) Date of Patent: Nov. 11, 2025

(54) DISPLAY PANEL HAVING A QUANTUM DOT LAYER IN A CAVITY BETWEEN A PLURALITY OF SUBSTRATES

(71) Applicant: Xiamen Tianma Microelectronics Co., Ltd., Xiamen (CN)

(72) Inventor: Jiayou Yan, Xiamen (CN)

(73) Assignee: XIAMEN TIANMA MICROELECTRONICS CO., LTD., Xiamen (CN)

( * ) Notice: Subject to any disclaimer, the term of this patent is extended or adjusted under 35 U.S.C. 154(b) by 793 days.

(21) Appl. No.: 17/737,057

(22) Filed: May 5, 2022

(65) Prior Publication Data
US 2023/0253534 A1 Aug. 10, 2023

(30) Foreign Application Priority Data
Feb. 8, 2022 (CN) .......................... 202210119406.6

(51) Int. Cl.
*H10H 20/851* (2025.01)
*H01L 25/075* (2006.01)
(Continued)

(52) U.S. Cl.
CPC ..... *H10H 20/8514* (2025.01); *H01L 25/0753* (2013.01); *H01L 25/167* (2013.01);
(Continued)

(58) Field of Classification Search
CPC .. H10K 59/40; H10K 59/878; H10K 59/8051; H10K 59/8052; H10H 20/8514; H10H 20/8142; H10H 20/84; H10H 20/857; H10H 2/812; H01L 25/167; H01L 25/0753; H01L 2924/12041
See application file for complete search history.

(56) References Cited

U.S. PATENT DOCUMENTS

| | | | |
|---|---|---|---|
| 2021/0151702 A1* | 5/2021 | Fan ...................... | H10K 59/878 |
| 2023/0102283 A1* | 3/2023 | Yu ....................... | H10H 20/8506 |
| | | | 257/91 |

(Continued)

FOREIGN PATENT DOCUMENTS

| CN | 109256455 A | 1/2019 |
|---|---|---|
| CN | 112133734 A | 12/2020 |
| CN | 112164705 B | 4/2021 |

*Primary Examiner* — Alonzo Chambliss
(74) *Attorney, Agent, or Firm* — East IP P.C.

(57) ABSTRACT

The present application discloses a display panel and a display apparatus. The display panel includes: a first substrate and a second substrate, and an isolation structure and a plurality of light-emitting devices between the first substrate and the second substrate, the second substrate and the first substrate being both connected to the isolation structure, the first substrate, the isolation structure and the second substrate forming a plurality of excitation cavities, and each of the light-emitting devices being in one of the excitation cavities; a quantum dot layer including quantum dots, in the excitation cavities and on a side of the light-emitting devices facing away from the first substrate; where sidewalls of the excitation cavities are provided with a reflection portion, at least a part of the reflection portion covers at least a part of the first substrate and at least a part of the second substrate.

20 Claims, 9 Drawing Sheets

A-A

(51) Int. Cl.
  *H01L 25/16* (2023.01)
  *H10H 20/814* (2025.01)
  *H10H 20/84* (2025.01)
  *H10H 20/857* (2025.01)
  *H10K 59/40* (2023.01)
  *H10K 59/80* (2023.01)

(52) U.S. Cl.
  CPC ........ *H10H 20/8142* (2025.01); *H10H 20/84* (2025.01); *H10H 20/857* (2025.01); *H10K 59/40* (2023.02); *H10K 59/878* (2023.02); *H01L 2924/12041* (2013.01); *H10K 59/8051* (2023.02); *H10K 59/8052* (2023.02)

(56) References Cited

U.S. PATENT DOCUMENTS

2023/0317696 A1* 10/2023 Wu .................... H01L 25/167
                                                                257/97
2024/0170620 A1*  5/2024 Moon ................ H10H 20/8316

* cited by examiner

100

A-A

A-A

A-A

A-A

A-A

A-A

A-A

A-A

A-A

A-A

A-A

A-A

A-A

A-A

DISPLAY PANEL HAVING A QUANTUM DOT LAYER IN A CAVITY BETWEEN A PLURALITY OF SUBSTRATES

CROSS-REFERENCE TO RELATED APPLICATION

This application claims priority to Chinese Patent Application No. 202210119406.6, filed on Feb. 8, 2022, which is hereby incorporated by reference in its entirety.

TECHNICAL FIELD

The present application relates to the technical field of display panels, and in particular to a display panel and a display apparatus.

BACKGROUND

In a micro light-emitting diode (Micro-LED) display panel, micro-LEDs are integrated at a high density and are used for displaying. A great advantage of micro LEDs over conventional LEDs is that each LED cell can dynamically and independently emit light as a sub-pixel. A micro-LED display panel has the characteristics of high efficiency, high brightness, high reliability and fast response time. The micro-LED display panel can excite different quantum dots to emit light by a same kind of micro-LED, to generate light of a color corresponding to a pixel unit of the display panel. Since all the micro LED devices have the same light-emitting capability, the light emission by the micro-LED display panel is more stable. Although the color accuracy of the light emitted by each pixel unit is high, when a plurality of pixel units emit light in a coordinated display, light emitted by quantum dots corresponding to adjacent pixel units will cross-talk with each other, resulting in chromatic aberration of the display panel and affecting the color gamut of the micro light-emitting diode display panel.

SUMMARY

Embodiments of the present application provide a display panel where the color purity of light emitted from the display panel is improved to improve the color gamut of the display panel.

In an aspect, embodiments of the present application provide a display panel including: a first substrate and a second substrate, and an isolation structure and a plurality of light-emitting devices between the first substrate and the second substrate, the second substrate and the first substrate being both connected to the isolation structure, the first substrate, the isolation structure and the second substrate forming a plurality of excitation cavities, and each of the light-emitting devices being in one of the excitation cavities; a quantum dot layer including quantum dots, in the excitation cavities and on a side of the light-emitting devices facing away from the first substrate; where sidewalls of the excitation cavities are provided with a reflection portion, at least a part of the reflection portion covers at least a part of the first substrate and at least a part of the second substrate, and light outlets are positioned on a side of the reflection portion close to the second substrate.

In the display apparatus according to the embodiments of the present application, the excitation cavities surrounding the quantum dot light-emitting devices are formed using the isolation structure. The inner walls of the excitation cavities are provided with the reflection portion, so that light emitted by the light-emitting devices can be reflected in the excitation cavities and used for exciting the quantum dots to emit light. The light emitted by exciting the quantum dots is also reflected in the excitation cavities and is emitted outside the excitation cavities from the light outlets for display, which improves the utilization rate of the light emitted by the light-emitting devices, that is, the efficiency of converting the light emitted by the light-emitting devices into the light emitted by the quantum dots. At the same time, due to the reflection portion in the excitation cavities, the light emitted by the light-emitting devices are emitted outside the excitation cavities from the light outlets but not from through the sidewalls of the excitation cavities. Crosstalk between light emitted by different light-emitting devices is avoided, thereby improving the color purity of the display image, making the display image of the display panel more realistic and improving the display quality of the display panel.

BRIEF DESCRIPTION OF THE DRAWINGS

In order to more clearly illustrate the technical solutions of embodiments of the present application, a brief description will be given below with reference to the need to be used in the embodiments of the present application. It is obvious that the drawings described below are only some embodiments of the present application, and for a person skilled in the art, other drawings can be obtained according to these drawings without involving any inventive effort.

REFERENCE NUMERALS

Figure 1:
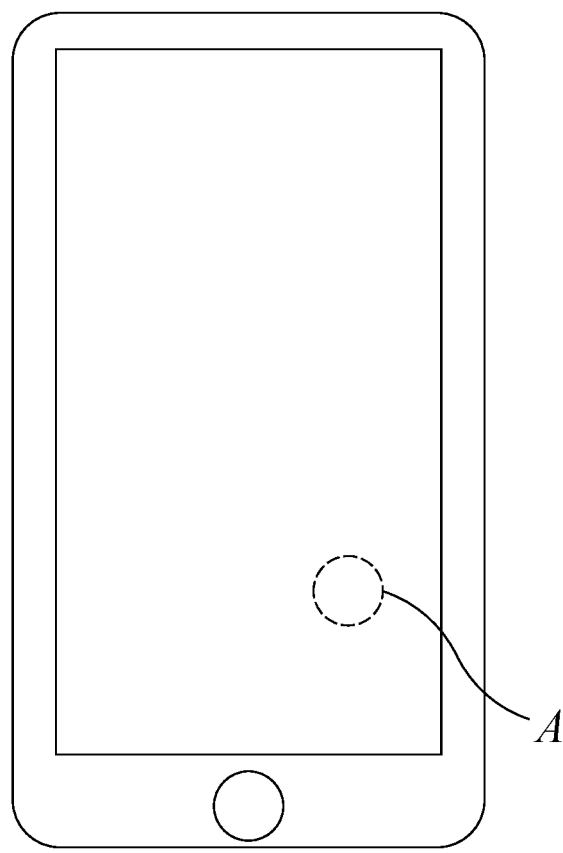
FIG. 1 is a schematic view of a display panel according to an embodiment of the present application.

100: Display panel; 110: Pixel unit;
10: First substrate; 11: First metal layer; 12: Signal line; 13: Insulation protective layer; Bonding layer; 15: Cathode line; 16a: Source electrode; 16b: Drain electrode; 16c: Gate electrode; 17: Active layer; 18: Insulation layer;
20: Second substrate;
30: Isolation structure; 31: First protrusion; 32: Second protrusion; 33: Insulation structure;
40: Quantum dot layer; 41: Quantum dot;
50: Light-emitting device;
60: Excitation cavity; Reflection portion; 62: Light outlet; 63: First reflection portion; 64: Second reflection portion;
70: Color resist layer; 71: Color resist unit; 72: Black matrix;
80: Scattering layer;
90: Touch layer; 91: Touch signal line.

DETAILED DESCRIPTION

Features and exemplary embodiments of various aspects of the present application are described in detail below. In the following detailed description, numerous specific details are set forth in order to provide a thorough understanding of the present application. However, it will be apparent to one skilled in the art that the present application may be practiced without some of these specific details. The following description of the embodiments is merely intended to provide a better understanding of the application by illustrating examples of the application.

It is remarked that embodiments and features of the embodiments described in this application can be combined with each other without conflict. Hereinafter, embodiments will be described in detail with reference to the accompanying drawings.

Relational terms such as first and second and the like are used solely to distinguish one entity or operation from another entity or operation without necessarily requiring or implying any actual such relationship or order between such entities or operations. Furthermore, the terms "includes", "including", or any other variation thereof, are intended to cover a non-exclusive inclusion, such that a process, method, article, or apparatus that includes a list of elements does not include only those elements but may include other elements not expressly listed or inherent to such process, method, article, or apparatus. An element proceeded by "includes. A" does not, without more constraints, preclude the existence of additional identical elements in the process, method, article, or apparatus that includes the element.

It will be understood that when referring to a layer, one region, or both as being "on" or "over" another layer, one region, or both, in describing the structure of a component, it is meant to refer to the layer or region directly on or between the layer or region and the other layer or region. Also, if the part is turned over, the one layer, one region, will lie "under" or "under" the other layer, the other region.

In addition, the term "and/or", as used herein, is merely an association that describes an associated object and indicates that there may be three relationships, e. G. A and/or B, may indicate that: there are three cases of A alone, A and B together, and B alone. In addition, the character "/", as used herein, generally indicates that the associated object is an "or" relationship.

It should be understood that, in embodiments of the present application, "B corresponding to A" means that B is associated with A from which B can be determined. However, it should also be understood that determining B from A does not mean determining B from A alone, and B may also be determined from A and/or other information.

A micro-LED display panel uses micro-LEDs as light-emitting devices. Generally, a pixel unit of the micro-LED display panel corresponds to a micro-LED, and the micro-LED further includes a quantum dot corresponding to the pixel unit. Light emitted by a micro-LED corresponding to a certain pixel unit excites a corresponding quantum dot to emit light. A color of the light emitted by the quantum dot is a color corresponding to the pixel unit. A plurality of pixel units cooperatively emit light to realize the display by the display panel. However, when a single pixel unit emits light with a low brightness, and when a plurality of pixel units cooperatively emit light, the display color purity is not high, which will affect the display quality of the display panel.

The applicant has found that, after a micro-LED of a certain pixel unit emits light, besides the light excites a quantum dot of the pixel unit to emit light, a part of the light is emitted to an adjacent pixel, so that a proportion of the light emitted by the micro-LED used for exciting the quantum dot is low, that is to say, the efficiency of the micro-LED exciting the quantum dot to emit light is low, resulting in that the brightness of the display light emitted by the display panel is low, which affects the display quality of the display panel. When the pixel unit and other pixel units simultaneously emit light, the light emitted by the quantum dot corresponding to the pixel unit will be emitted to the adjacent pixel unit, so that the light of a corresponding color emitted by the pixel unit will be mixed into the light of a corresponding color of the adjacent pixel unit, resulting in a decrease in the color purity of the light emitted by the pixel unit, and also resulting in a poor display quality of the display panel.

In view of the above-mentioned analysis, the applicant has proposed a display panel. The display panel is provided with an isolation structure between a first substrate and a second substrate, so that the first substrate, the second substrate and the isolation structure form excitation cavities. Light-emitting devices and quantum dots are arranged in the excitation cavities, and at the same time, inner walls of the excitation cavity are provided with a reflection portion. Light emitted by the light-emitting devices are reflected in the excitation cavities by the reflection portion, so that the light emitted by the light-emitting devices can be more sufficiently used to excite the quantum dots to emit light, thereby improving the luminous brightness and the display quality of the display panel. The excitation light of the quantum dots is also reflected in the excitation cavities by the reflection portion, so that more excitation light can be emitted outside the excitation cavities from light outlets and used for display, which further improves the luminous brightness and the display quality of the display panel. In addition, the reflection portion can prevent excitation light of the quantum dots corresponding to different light colors from cross-talking with each other, thereby increasing the color purity of the light emitted by the apparatus in displaying and improving the display quality of the display panel.

Figure 2:
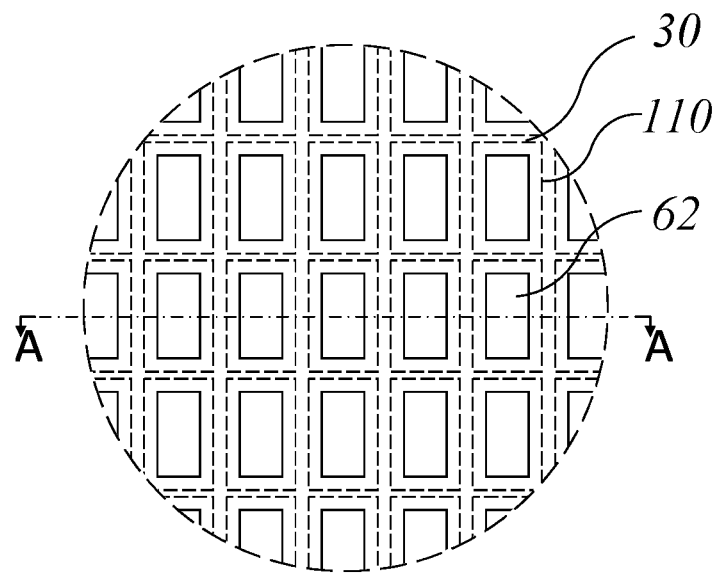
FIG. 2 is an enlarged view of a region A shown in FIG. 1 of a display panel according to an embodiment of the present application.
Figure 3:
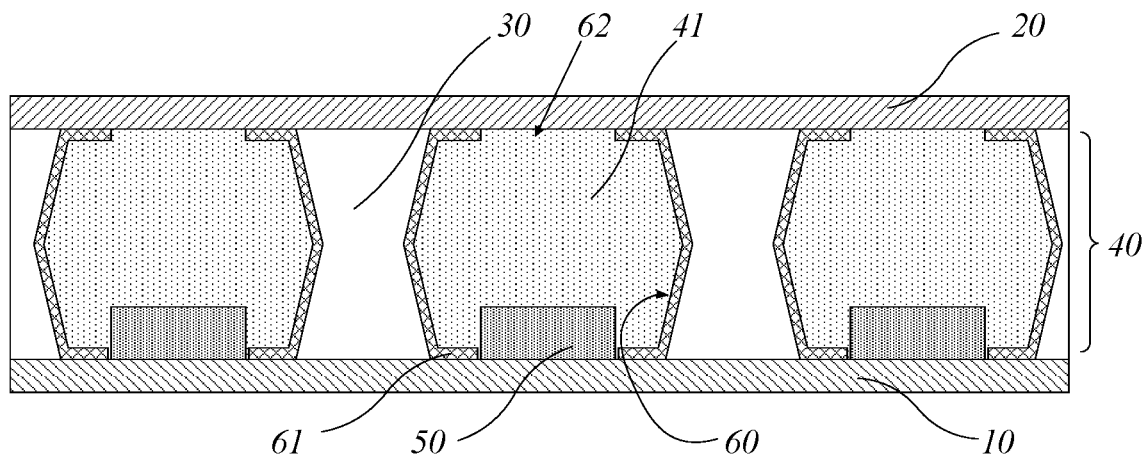
FIG. 3 is a cross-sectional view of a section A-A shown in FIG. 2 of a display panel according to an embodiment of the present application.
Figure 4:
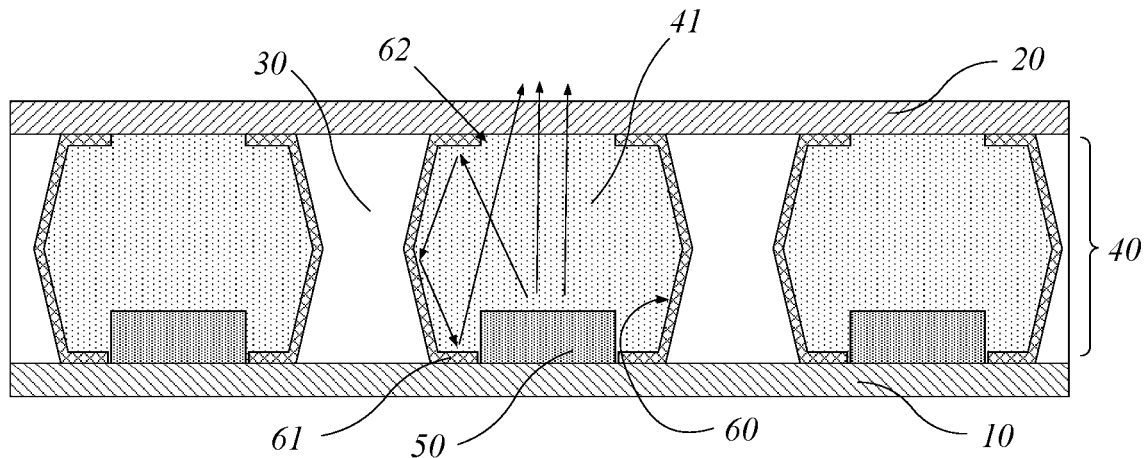
FIG. 4 is an optical pathway diagram in a cross-sectional view of a section A-A shown in FIG. 2 of a display panel according to an embodiment of the present application.

FIG. 1 is a schematic view of a display panel according to an embodiment of the present application. FIG. 2 is an enlarged view of a region A of a first display panel shown in FIG. 1. FIG. 3 is a cross-sectional view of a section A-A shown in FIG. 2 of a display panel according to an embodiment of the present application. FIG. 4 is an optical pathway diagram of a cross-sectional view of a section A-A shown in FIG. 2 of a display panel according to an embodiment of the present application.

With reference to FIG. 1 to FIG. 4, an embodiment of the present application provides a display panel 100 including: a first substrate 10 and a second substrate 20, and an isolation structure 30 and a plurality of light-emitting devices 50 between the first substrate 10 and the second substrate 20, the second substrate 20 and the first substrate 10 being both connected to the isolation structure 30, the first substrate 10, the isolation structure 30 and the second substrate 20 forming a plurality of excitation cavities 60, and the light-emitting devices 50 being in the excitation cavities 60; a quantum dot layer 40 in the excitation cavities 60 and on a side of the light-emitting devices 50 facing away from the first substrate 10; where sidewalls of the excitation cavities 60 are provided with a reflection portion 61, at least a part of the reflection portion 61 covers at least a part of the first substrate 10 and at least a part of the second substrate 20, and light outlets 62 are positioned on a side of the reflection portion 61 close to the second substrate 20.

The first substrate 10 may be a substrate of the display panel 100, and may be formed of polymer materials such as glass, polyimide (PI), polycarbonate (PC), polyethersulfone (PES), polyethylene terephthalate (PET), polyethylene naphthalate (PEN), polyaryl compound (PAR), or glass fiber reinforced plastic (FRP). The first substrate 10 may be transparent, translucent or opaque. The second substrate 20 may be a cover plate of the display panel 100, and may be made of a material such as glass or polyimide (PI). The second substrate 20 is made of a transparent material. The second substrate 20 may also be an encapsulation layer of the display panel 100 configured to encapsulate the display panel of the display panel 100. The first substrate 10 and the second substrate 20 may also be flexible substrates formed of a polymer having a relatively thin thickness, such as polyimide.

With further reference to FIG. 2 to FIG. 4, the isolation structure 30 is positioned between the first substrate 10 and the second substrate 20. The isolation structure 30, the first substrate 10 and the second substrate 20 form a plurality of excitation cavities 60 that are spaced from each other.

With further reference to FIG. 3 and FIG. 4, the light-emitting devices 50 may be LEDs or OLEDs, such as micro-LEDs or mini-LEDs. Each of the light-emitting devices 50 is positioned in one of the excitation cavities 60. The light-emitting device 50 may be arranged on a side of the first substrate 10 facing the second substrate 20, so that the light-emitting device 50 can emit light in a direction toward the second substrate 20.

With further reference to FIG. 3 and FIG. 4, each of quantum dots 41 in the quantum dot layer 40 are positioned within one of the excitation cavities 60 on a side of the light-emitting devices 50 facing away from the first substrate 10, such that light emitted by the light-emitting devices 50 can excite the quantum dots 41 to emit light. The light emitted by excited quantum dots 41 in a single excitation cavity 60 is of a same color. Each excitation cavity 60 corresponds to one pixel unit 110 of the display panel 100. Different excitation cavities 60 can correspond to different pixel units 110 by setting different colors of light emitted by exited quantum dots 41 in different excitation cavities 60, so as to realize the display by the display panel 100. For example, the display panel 100 includes a red pixel unit, a green pixel unit and a blue pixel unit. The red pixel unit, the green pixel unit and the blue pixel unit are a same type of micro-LEDs. Light emitted by the micro-LED corresponding to the red pixel unit illuminates the quantum dot corresponding to the red pixel unit to excite red light. Similarly, light emitted by the micro-LED corresponding to the green pixel unit illuminates the quantum dot corresponding to the green pixel unit to excite green light. Light emitted by the micro-LED corresponding to the blue pixel unit illuminates the quantum dot corresponding to the blue pixel unit to excite blue light. The red pixel unit, the green pixel unit and the blue pixel unit cooperatively emit light to realize the display by the display panel 100.

With further reference to FIG. 3 and FIG. 4, sidewalls of the excitation cavities 60 are provided with a reflection portion 61, so that almost no light is directly emitted from one excitation cavity 60 into an adjacent excitation cavity 60. At least a part of the reflection portion 61 covers at least a part of the first substrate 10, which can reduce light leaked from the first substrate 10. The light-emitting devices 50 are arranged on the portion of the first substrate 10 not covered by the reflection portion 61. Since the reflection portion 61 may be made of a metal material, to leave some place being uncovered by the reflection portion 61 for the arrangement of the light-emitting devices 50 can avoid a short circuit of the light-emitting device 50. At least a part of the reflection portion 61 covers at least a part of the second substrate 20. Light outlets 62 are arranged on a side of the reflection portion 61 close to the second substrate 20. By covering the second substrate 20 with the reflection portion 61, the size of the light outlet 62 can be controlled, thereby defining the aperture ratio of the display panel.

With further reference to FIG. 4, the light emitted by the light-emitting devices 50 is reflected back and forth in the excitation cavities 60 by the reflection portion 61. Therefore, almost no light emitted by a light-emitting device 50 in one excitation cavity 60 can be directed into another excitation cavity 60, so that the light emitted by the light-emitting devices 50 can be sufficiently used to excite the quantum dots 41 to emit light, thereby improving the efficiency of the light emitted the light-emitting devices 50 to excite the quantum dots 41 to emit light, improving the brightness of the excited light of the quantum dots 41, and further improving the display quality of the display panel 100. Light emitted by the excited quantum dots 41 is also reflected back and forth in the excitation cavities 60 by the reflection portion 61. Therefore, most of the light emitted by the excited quantum dot 41 in a certain excitation cavity 60 can be emitted outside the excitation cavity from a light outlet 62 and used for the display by the display panel 100, thereby improving the luminous brightness of the display panel 100 and improving the display quality of the display panel 100. Since almost to no light excited by a quantum dot 41 in a certain excitation cavity 60 is directed into an adjacent excitation cavity 60, the possibility of cross-talk between light emitted outside adjacent excitation cavities 60 from light outlets 62 of the reflection portion 61 corresponding to the excitation cavities 60 is reduced, thereby improving the color purity of light emitted outside the excitation cavities 60 from light outlets 62 of the reflection portion 61 corresponding to the excitation cavities 60, thereby improving the accuracy of the color displayed by the display panel 100 and improving the display quality of the display panel 100.

Further, when the light-emitting device 50 is a micro-LED, a blue light micro-LED or an ultraviolet light micro-LED is generally used as the light-emitting device 50. Since the light emitted by the light-emitting devices 50 can be reflected within the excitation cavities 60 and sufficiently used to excite the quantum dots 41 to emit light, less blue or ultraviolet light will be emitted outside from the light outlet 62, the damage to user's eyes will be reduced, and the damage to the surrounding living being by the blue or ultraviolet light will also be reduced.

Further, with further reference to FIG. 3 and FIG. 4, the excitation cavities 60 is in one-to-one correspondence with the light-emitting devices 50. Compared with the arrangement where a plurality of light-emitting devices 50 are arranged in one excitation cavity 60, when the excitation cavities 60 is in one-to-one correspondence with the light-emitting devices 50, an area of the excitation cavity 60 in the plane where the first substrate 10 is located is smaller. Since the excitation cavity 60 corresponds to the pixel unit 110 of the display panel 100, the area of a single pixel unit 110 is made smaller, thereby increasing the pixel density of the display panel 100, improving the display resolution, and further improving the display quality of the display panel 100.

Figure 5:
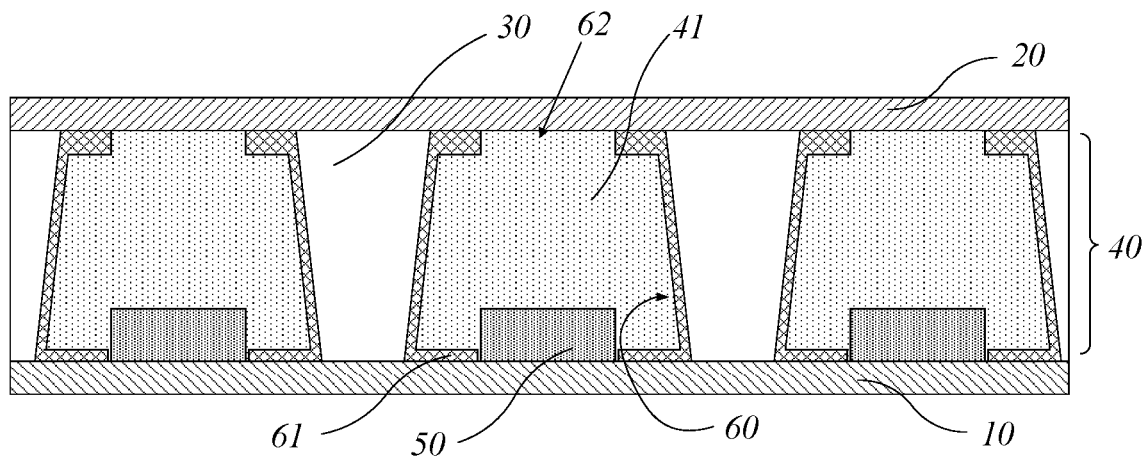
FIG. 5 is a cross-sectional view of a section A-A shown in FIG. 2 of another display panel according to an embodiment of the present application.
Figure 6:
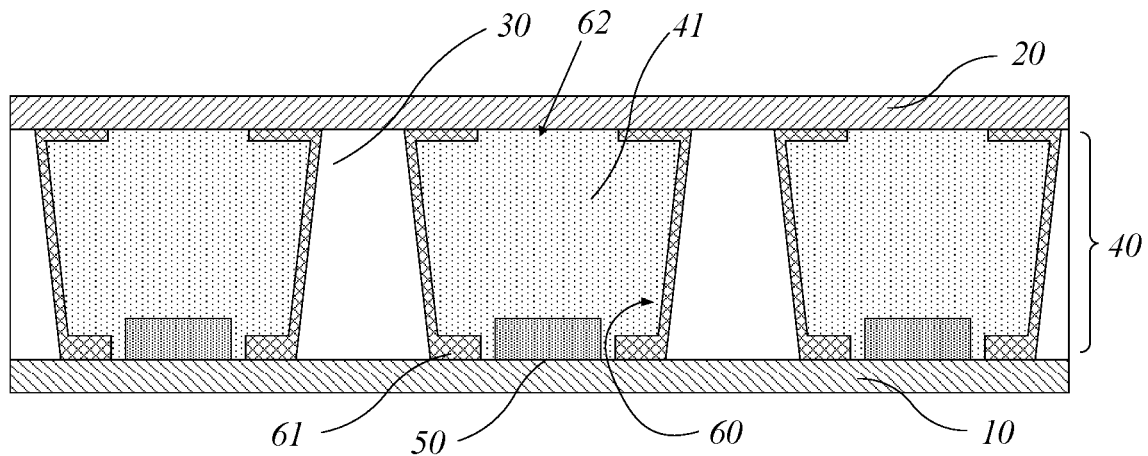
FIG. 6 is a cross-sectional view of a section A-A shown in FIG. 2 of another display panel according to an embodiment of the present application.

FIG. 5 is a cross-sectional view of a section A-A shown in FIG. 2 of another display panel according to an embodiment of the present application. FIG. 6 is a cross-sectional view of a section A-A shown in FIG. 2 of another display panel according to an embodiment of the present application.

Optionally, with reference to FIG. 5 and FIG. 6, the isolation structure 30 is arranged on the first substrate 10 and extends toward the second substrate 20; or, the isolation structure 30 is arranged on the second substrate 20 and extends toward the first substrate 10. When the isolation structure 30 is arranged on the first substrate 10, the isolation structure 30 may be formed on the first substrate 10, and then the second substrate 20 is connected to the isolation structure 30. A cross-sectional area of the excitation cavity 60 gradually increases along the direction from the first substrate 10 to the second substrate 20. When the isolation structure 30 is arranged on the second substrate 20, the isolation structure 30 may be formed on the second substrate 20, and then the first substrate 10 is connected to the isolation structure 30. A cross-sectional area of the excitation cavity 60 gradually decreases in the direction from the first substrate 10 to the second substrate 20. The cross-sectional pattern of the excitation cavity 60 on a plane perpendicular to the first substrate 10 is trapezoidal. When the light emitted by the light-emitting device 50 hits the sidewall of the excitation cavity 60, the tilted sidewall of the excitation cavity 60 can reflect the light toward the middle of the excitation cavity 60, so as to improve the efficiency of the light emitted by the light-emitting device 50 to excite the quantum dot 41 to emit light, thereby improving the luminous brightness of the display panel 100 and improving the display quality of the display panel 100.

Figure 7:
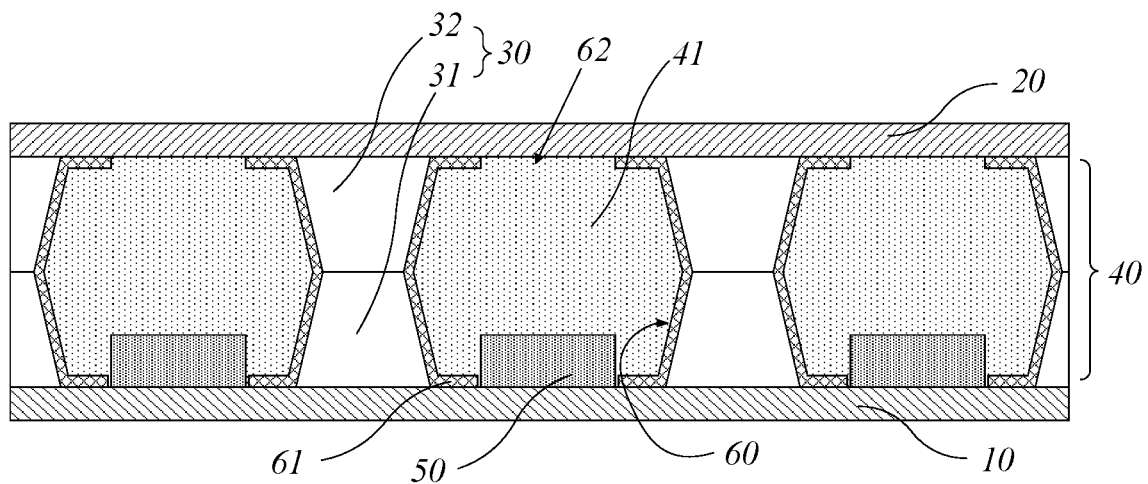
FIG. 7 is a cross-sectional view of a section A-A shown in FIG. 2 of another display panel according to an embodiment of the present application.

FIG. 7 is a cross-sectional view of a section A-A shown in FIG. 2 of another display panel according to an embodiment of the present application.

Preferably, with reference to FIG. 7, the isolation structure 30 includes: a first protrusion 31 on the first substrate 10; a second protrusion 32 on the second substrate 20; projections of the first protrusion 31 and the second protrusion 32 at least partially overlap in a direction perpendicular to the first substrate 10. In the formation of the isolation structure 30, a first protrusion 31 is formed on the first substrate 10 and a second protrusion 32 is formed on the second substrate 20, and the first protrusion 31 and the second protrusion 32 are aligned and make the first substrate 10 bonded to the second substrate 20, so that the first substrate 10, the first protrusion 31, the second protrusion 32 and the second substrate 20 form the excitation cavities 60. In the above-mentioned formation process, the quantum dots 41 may be firstly filled in the space surrounded by the first protrusion 31. Then the first protrusion 31 and the second protrusion 32 are bonded together, so that the quantum dots 41 are formed in the excitation cavities 60. Alternatively, the quantum dots 41 may be firstly filled in the space surrounded by the second protrusion 32. Then the first protrusion 31 and the second protrusion 32 are bonded together, so that the quantum dots 41 are formed in the excitation cavities 60.

With further reference to FIG. 7, the cross-sectional area of the first protrusion 31 gradually decreases in a direction from the first substrate 10 toward the second substrate 20. The cross-sectional area of the second protrusion 32 gradually decreases in the direction from the second substrate 20 toward the first substrate 10. The sidewall of the first protrusion 31 and the sidewall of the second protrusion 32 together form the sidewalls of the excitation cavities 60. Therefore, along the thickness direction of the display panel 100, the cross-sectional area of the middle part of the excitation cavity 60 is greater than the cross-sectional areas of its two ends, so that the excitation cavity 60 forms a space with a thick middle and a thin top and bottom, that is to say, the cross-sectional pattern of the excitation cavity 60 perpendicular to the first substrate 10 forms a hexagon. The inner sidewall of the excitation cavity 60 forms an inner concave surface. Light emitted by the light-emitting device 50 can be emitted to the middle part of the excitation cavity 60 after reflected by the inner concave sidewall of the excitation cavity 60. Therefore, the light emitted by the light-emitting device 50 is more likely to be converged toward the middle of the excitation cavity 60 and excite the quantum dots 41 to emit light, thereby further improving the efficiency of the light emitted by the light-emitting device 50 to excite the quantum dots 41 to emit light, thereby improving the luminous brightness of the display panel 100 and improving the display quality of the display panel 100. Preferably, the sidewall of the excitation cavity 60 forms a curved wall. For example, the excitation cavity 60 forms a spherical table shape, and the inner sidewall of the excitation cavity 60 forms a spherical belt curved surface, so as to further improve the convergence of light reflected in the excitation cavity 60.

With further reference to FIG. 7, in the thickness direction of the display panel 100, the ratio of a height of the first protrusion 31 to a height of the second protrusion 32 is greater than or equal to 1:2, and is less than or equal to 2:1. Since the reflection portion 61 is positioned at the sidewall formed by the first protrusion 31 and the second protrusion 32, when the ratio of the height of the first protrusion 31 to the height of the second protrusion 32 is greater than or equal to 1:2 and less than or equal to 2:1, light emitted by the light-emitting device 50 can converge toward the middle of the excitation cavity 60 after being reflected by the reflection portion 61, and is used to excite the quantum dot 41 to emit light. Therefore, the number of times of reflection of light emitted by the light-emitting device 50 in the excitation cavity 60 can be reduced, so as to reduce the total travel of the light emitted by the light-emitting device 50 before the quantum dot 41 is excited to emit light, thereby reducing the attenuation of the light emitted by the light-emitting device 50 in the excitation cavity 60, further improving the efficiency of the light emitted by the light-emitting device 50 to excite the quantum dot 41 to emit light, improving the luminous brightness of the display panel 100, and further improving the display quality of the display panel 100. In the process of forming the isolation structure 30, when the height of the first protrusion 31 is greater than the height of the second protrusion 32, the quantum dots 41 are formed in a space surrounded by the first protrusion 31. Then the first protrusion 31 and the second protrusion 32 are bonded together, so that the quantum dots 41 are formed in the excitation cavities 60. When the height of the first protrusion 31 is less than the height of the second protrusion 32, the quantum dots 41 are formed in the space surrounded by the second protrusion 32. Then the first protrusion 31 and the second protrusion 32 are bonded together, so that the quantum dots 41 are formed in the excitation cavities 60. When the height of the first protrusion 31 is equal to the height of the second protrusion 32, the quantum dots 41 may be formed in the space surrounded by either the first protrusion 31 or the space surrounded by the second protrusion 32.

Figure 8:
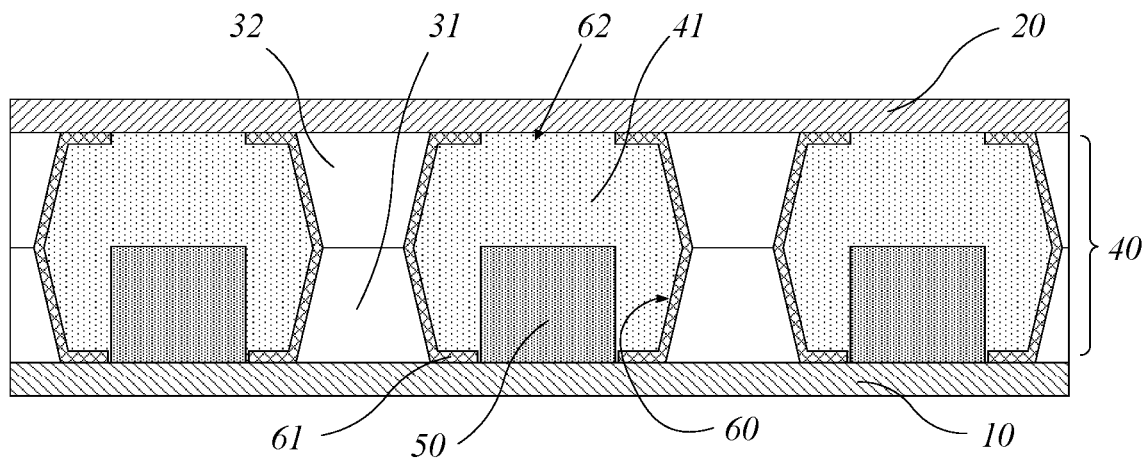
FIG. 8 is a cross-sectional view of a section A-A shown in FIG. 2 of another display panel according to an embodiment of the present application.

FIG. 8 is a cross-sectional view of a section A-A shown in FIG. 2 of another display panel according to an embodiment of the present application.

Optionally, with reference to FIG. 8, the light-emitting device 50 includes an out-light surface. A junction of the first protrusion 31 and the second protrusion 32 is coplanar with the out-light surface. Since the out-light surface of the light-emitting device 50 is coplanar with the junction of the first protrusion 31 and the second protrusion 32, the light-emitting device 50 can emit light in the middle part of the excitation cavity 60 with the largest cross-sectional area, so that most of the emitted light can be emitted to the reflection portion 61 at a small incident angle and reflected to the middle part of the excitation cavity 60 for exciting the quantum dots 41 to emit light. Therefore, the optical pathway of the light emitted by the light-emitting device 50 before exciting the quantum dots 41 can be further shortened, thereby further reducing the attenuation of the light emitted by the light-emitting device 50. Thus, the efficiency of the light emitted by the light-emitting device 50 to excite the quantum dots 41 to emit light is further improved, the luminous brightness of the display panel 100 is improved, and the display quality of the display panel 100 is further improved.

Further, with further reference to FIG. 7 and FIG. 8, a volume of each of the light-emitting devices 50 is less than or equal to ⅔ of a volume of one of the excitation cavities 60 corresponding to the light-emitting device 50. When the light emitted by the light-emitting device 50 is reflected in the excitation cavity 60, the small volume of the light-emitting device 50 can reduce interference of the light-emitting device 50 on the optical pathway of the reflected light, so that the light can be used to excite the quantum dots 41 to emit light. In addition, when the volume of the light-emitting device 50 is small, the volume of the quantum dots 41 in the excitation cavity 60 increases, so that the light emitted by the light-emitting device 50 can better excite the quantum dots 41 to emit light, and the possibility of the light emitted by the light-emitting device 50 which has not excited the quantum dots 41 to reflect back and forth in the excitation cavity 60 is reduced, thereby shortening the optical pathway of the light emitted by the light-emitting device 50 before exciting quantum dots 41 to emit light, thereby reducing the attenuation of the light emitted by the light-emitting device 50. Thus, the efficiency of the light emitted by the light-emitting device 50 to excite the quantum dots 41 to emit light is improved, the luminous brightness of the display panel 100 is improved, and the display quality of the display panel 100 is further improved.

Figure 9:
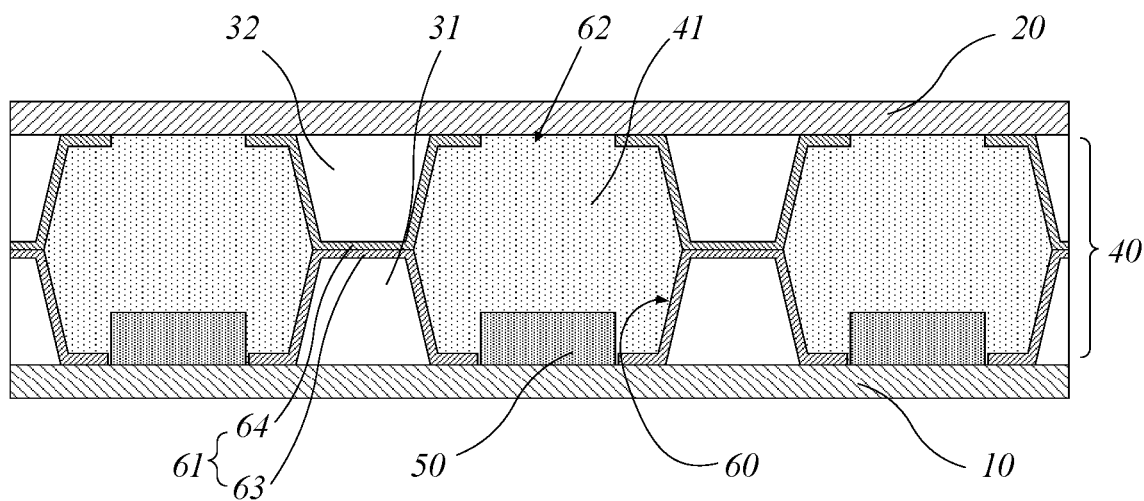
FIG. 9 is a cross-sectional view of a section A-A shown in FIG. 2 of another display panel according to an embodiment of the present application.

FIG. 9 is a cross-sectional view of a section A-A shown in FIG. 2 of another display panel according to an embodiment of the present application.

Further, with reference to FIG. 9, the reflection portion 61 includes: a first reflection portion 63 on a side of the first protrusion 31 facing away from the first substrate 10, at least a part of the first reflection portion 63 covering the first protrusion 31, and at least a part of the first reflection portion 63 covering at least a part of the first substrate 10; a second reflection portion 64 on a side of the second protrusion 32 facing away from the second substrate 20, at least a part of the second reflection portion 64 covering the second protrusion 32, and at least a part of the second reflection portion 64 covering at least a part of the second substrate 20. By covering the first protrusion 31 with the first reflection portion 63 and covering the second protrusion 32 with the second reflection portion 64, the formation of the reflection portion 61 is facilitated, while the reflection of light in the excitation cavity 60 by the reflection portion 61 is ensured. In the formation process, the first protrusion 31 is formed on the first substrate 10, and then the first reflection portion 63 is formed, so that the first reflection portion 63 covers the first protrusion 31 and a part of the first substrate 10. The second protrusion 32 is formed on the second substrate 20, and then the second reflection portion 64 is formed, so that the second reflection portion 64 covers the second protrusion 32 and a part of the second substrate 20. Quantum dots are added in the region surrounded by the first protrusion 31 or in the region surrounded by the second protrusion 32. A frame glue is applied on an end face of the first protrusion 31 facing away from the first substrate 10 or an end face of the second protrusion 32 facing away from the second substrate 20. Then the first protrusion 31 and the second protrusion 32 are aligned, so that the first protrusion 31 and the second protrusion 32 are attached and the space therebetween is vacuumed, so that the first protrusion 31 and the second protrusion 32 are adhered and bonded, so as to form the excitation cavities 60. The part of the first reflection portion 63 covering the sidewall of the first protrusion 31, the part of the second reflection portion 64 covering the sidewall of the second protrusion 32, the part of the first reflection portion 63 covering a part of the first substrate 10 and the part of the second reflection portion 64 covering a part of the second substrate 20 together form the reflection portion 61 of the sidewalls of the excitation cavities 60.

Figure 10:
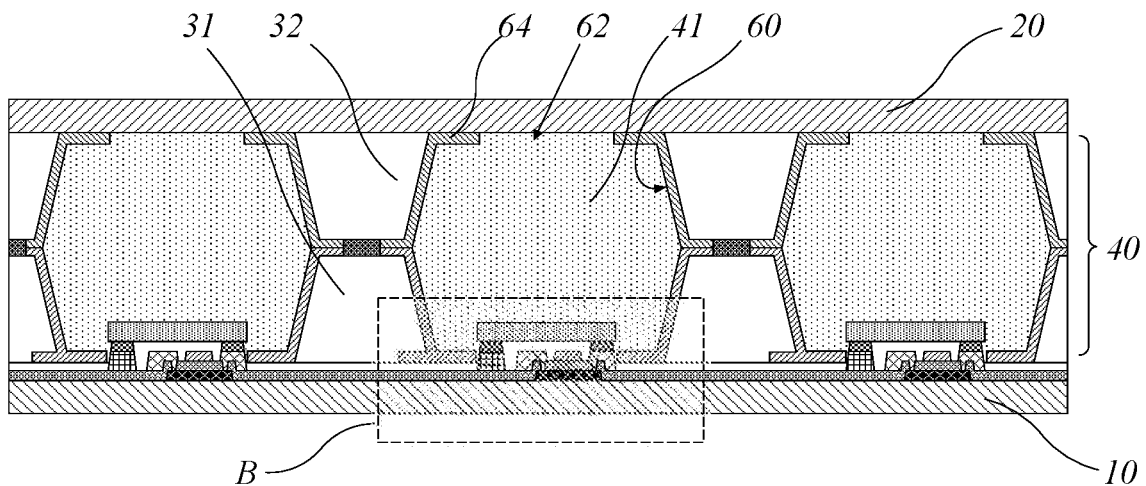
FIG. 10 is a cross-sectional view of a section A-A shown in FIG. 2 of another display panel according to an embodiment of the present application.
Figure 11:
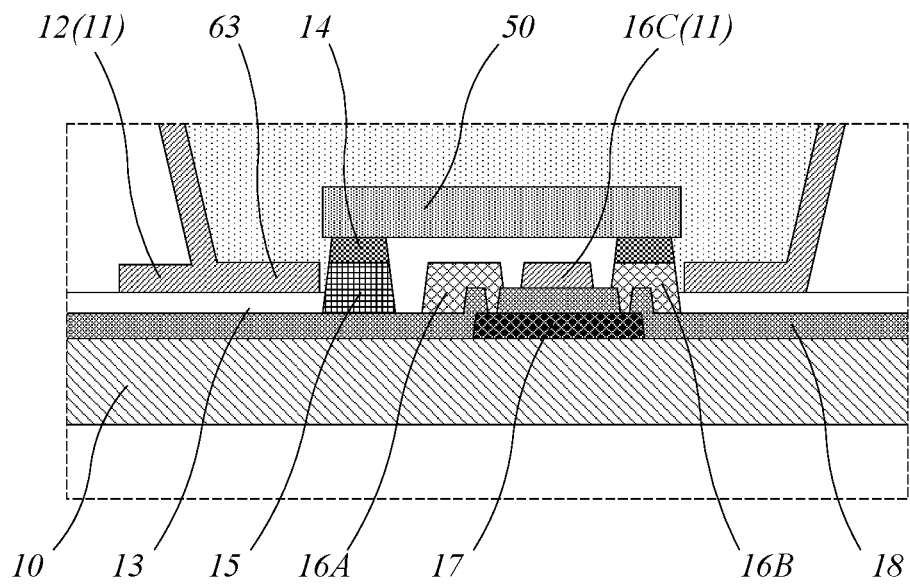
FIG. 11 is an enlarged view of a region B shown in FIG. 10 of a display panel according to an embodiment of the present application.

FIG. 10 is a cross-sectional view of a section A-A shown in FIG. 2 of another display panel according to an embodiment of the present application. FIG. 11 is an enlarged view of the region B shown in FIG. 10 of a display panel according to an embodiment of the present application.

Further, with reference to FIG. 10 and FIG. 11, the first substrate 10 includes a first metal layer 11 between the light-emitting devices 50 and the first substrate 10. At least a part of the first reflection portion 63 is co-layered with the first metal layer 11. For example, the display panel 100 may further include an array layer. The first metal layer 11 is at least a part of the array layer. For example, the first metal layer 11 may be a scanning line layer or a data line layer.

In an example, the first metal layer 11 is a scanning line layer. The array layer further includes a thin film transistor structure (Thin Film Transistor, TFT). The display panel 100 controls the light-emitting devices 50 to emit light through the thin film transistor structure. The thin film transistor structure includes: an active layer 17 for forming a thin film transistor and including a source electrode region and a drain electrode region formed by doping N-type impurity ions or P-type impurity ions, and a channel region being between the source electrode region and the drain electrode region; an insulation layer 18 on the active layer 17; a gate electrode 16C of the thin film transistor on the insulation layer 18, the gate electrode 16C being in the same layer as the first metal layer 11. The source electrode 16A and the drain electrode 16B of the thin film transistor are positioned on the insulation layer 17. The source electrode 16A and the drain electrode 16B are electrically connected (or coupled) to the source electrode region and the drain electrode region, respectively, through a via formed by selectively removing the insulation layer 18. The drain electrode 16B is electrically connected to anodes of the light-emitting devices 50 through a bonding layer 14. The display panel 100 further includes a cathode line 15 electrically connected to cathodes of the light-emitting devices 50 through the bonding layer 14. The parts of bonding layer 14 connecting the cathodes and the anodes of the light-emitting device 50 are provided with insulation therebetween. The display panel 100 further includes an insulation protective layer 13. The first protrusion 31 and the first reflective layer 63 are both arranged on a side of the insulation protective layer 13 facing away from the first substrate 10. In consideration of the reflection characteristics of the first reflection portion 63, the first reflection portion 63 may be made of a metal material. When the first reflection portion 63 is made of a metal material, the first reflection portion 63 can be reused with the first metal layer 11 in the same layer to simplify the complexity of the wiring design of the first metal layer 11 and reduce the thickness of the display panel 100.

Further, with further reference to FIG. 10 and FIG. 11, the first metal layer 11 includes a signal line 12. At least a part of the first reflection portion 63 being reused as the signal line 12. The first reflection portion 63 and the second reflection portion 64 are insulated from each other. When the first metal layer 11 is reused with a part of the first reflection portion 63 in a same layer, the first reflection portion 63 can be used as the signal line 12 of the first metal layer 11. A part of the first reflection portion 63 covers the first substrate 10. Thus, the part of the first reflecting layer covering the first substrate 10 can be reused as the signal line 12 of the first metal layer 11. Since the cross-sectional area of the first reflection portion 63 is larger than the cross-sectional area of the signal line 12, when the first reflection portion 63 is reused as the signal line 12, the cross-sectional area of the signal line 12 becomes larger, so that the actual impedance of the signal line 12 becomes smaller. Therefore, the signal attenuation caused by the signal line 12 and the power consumption of the signal line 12 are reduced, thereby making the control of the display light of the display panel 100 more accurate and improving the display quality of the display panel 100. When the first metal layer 11 is a scanning line layer, the signal line 12 is a scanning line, and when the first metal layer 11 is a data line layer, the signal line 12 is a data line.

With further reference to FIG. 10 and FIG. 11, an insulation structure 33 is arranged at the junction of the first protrusion 31 and the second protrusion 32. The insulation structure 33 penetrates through the first reflection portion 63 and the second reflection portion 64 in the thickness direction of the display panel 100. The insulation structure 33 surrounds the excitation cavities 60. At least a part of the first reflection portion 63 and at least a part of the second reflection portion 64 are positioned in a region surrounded by the insulation structure 33. The part of the first reflection portion 63 positioned in the region surrounded by the insulation structure 33 is reused as a part of the signal line 12. The isolation structure 30 extends in the plane of the display panel 100, and the excitation cavities 60 are equivalent to structures penetrating through the isolation structure 30. Therefore, the first reflection portion 63 and the second reflection portion 64 also extend in the plane of the display panel 100. When the first reflection portion 63 is reused as the signal line 12, the insulation structure 33 can separate the first reflection portion 63 into parts according to areas corresponding to the excitation cavities 60, so that parts of the first reflection portion 63 corresponding to adjacent excitation cavities 60 can be insulated from each other to prevent a short circuit between the signal lines 12 that the parts of the first reflection portion 63 corresponding to the adjacent excitation cavity 60 reused as. That is, the insulation structure 33 can divide the first reflection portion 63 into an array of multiple parts. The parts of the first reflection portion 63 are insulated from each other. The insulation structure 33 is arranged at the junction of the first projection 31 and the second projection 32, so that the insulation structure 33 does not destroy the reflecting functions of the first reflection portion 63 and the second reflection portion 64 within individual excitation cavities 60.

Figure 12:
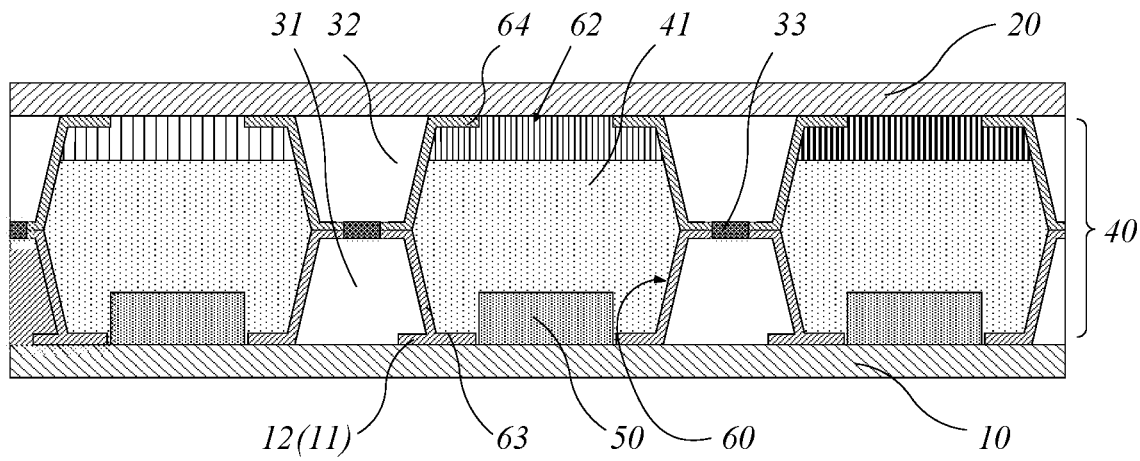
FIG. 12 is a cross-sectional view of a section A-A shown in FIG. 2 of another display panel according to an embodiment of the present application.
Figure 13:
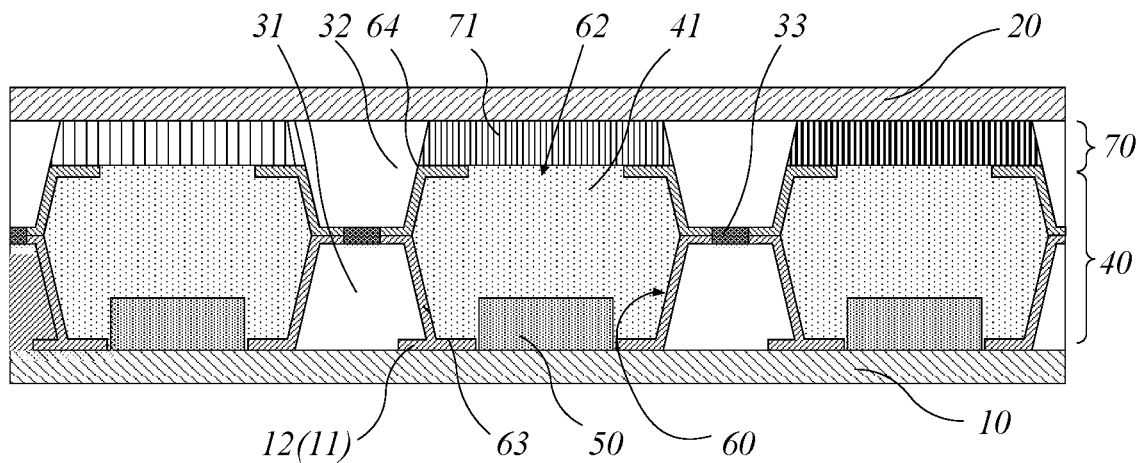
FIG. 13 is a cross-sectional view of a section A-A shown in FIG. 2 of another display panel according to an embodiment of the present application.

FIG. 12 is a cross-sectional view of a section A-A shown in FIG. 2 of another display panel according to an embodiment of the present application. FIG. 13 is a cross-sectional view of a section A-A shown in FIG. 2 of another display panel according to an embodiment of the present application.

Further, with reference to FIG. 12 and FIG. 13, the display panel 100 according to the embodiments of the present application further includes a color resist layer 70 on a side of the second substrate 20 facing the first substrate 10. The color resist layer 70 includes a plurality of color resist units 71. Each of the color resist units 71 covers one of the light outlets 62. The color resist unit 71 is in one-to-one correspondence with the quantum dots 41. A color of the excitation light of a quantum dot 41 is the same as a color of the corresponding color resist unit 71. The color resist layer 70 is configured to filter light emitted outside from the light outlets 62. The color resist units 71 being in one-to-one correspondence with the quantum dots 41 means that a color of each of the color resist units 71 is the same as a color of excitation light of one of the quantum dots 41 corresponding to the color resist unit 71. A small amount of the light emitted by the light-emitting devices 50 that is emitted outside directly from the light outlets 62 without exciting the quantum dots 41 to emit light can be filtered out by the color resist units 71. Thus, crosstalk of the light emitted by the light-emitting devices 50 to the excitation light of the quantum dots 41 is further reduced, so that the color purity of the light emitted outside from the light outlets 62 is higher. In addition, the blue light or ultraviolet light emitted by the light-emitting devices 50 can be filtered out by the color resist units 71 to reduce the damage to the user's eyes by the blue light or ultraviolet light.

Optionally, with further reference to FIG. 12 and FIG. 13, the color resist units 71 may be positioned between the reflection portion 61 and the second substrate 20, or may be positioned between the reflection portion 61 and the quantum dots 41 (that is, the reflection portion 61 is positioned between the color resist units 71 and the second substrate 20). When the color resist units 71 are positioned between the reflection portion 61 and the second substrate 20, in the formation process, first the second protrusion 32 of the isolation structure 30 is formed on the second substrate 20. Then the color resist units 71 are formed in the space surrounded by the second protrusion 32. Then the second reflection portion 64 of the reflection portion 61 is formed. Then the first substrate 10 formed with the first protrusion 31 and the first reflection portion 63 is bonded to form the excitation cavities 60. When the reflection portion 61 is positioned between the color resist units 71 and the second substrate 20, in the formation process, first the second protrusion 32 of the isolation structure 30 is formed on the second substrate 20. Then the second reflection portion 64 of the reflection portion 61 is formed. Then the color resist units 71 are formed in the space surrounded by the second protrusion 32 covered with the second reflection portion 64. Then the first substrate 10 formed with the first protrusion 31 and the first reflection portion 63 is bonded to form the excitation cavities 60.

Figure 14:
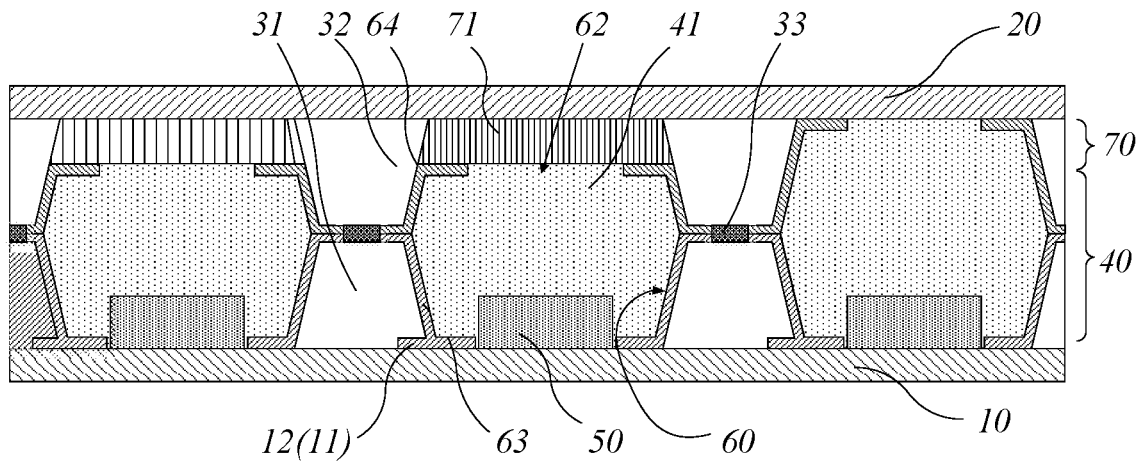
FIG. 14 is a cross-sectional view of a section A-A shown in FIG. 2 of another display panel according to an embodiment of the present application.

FIG. 14 is a cross-sectional view of a section A-A shown in FIG. 2 of another display panel according to an embodiment of the present application.

Optionally, with reference to FIG. 14, at least one of the color resist units 71 is positioned between the reflection portion 61 and the second substrate 20. At least one of the color resist units 71 is positioned between the quantum dot layer 40 and the reflection portion 61. When a color of light emitted by a light-emitting device 50 is the same as a color of light emitted by the quantum dot 41 that is excited by the light-emitting device 50, a color resist unit 71 of the corresponding color may not be arranged in the excitation cavity 60 corresponding to the light-emitting device 50, so that more light can be emitted outside from the light outlet 62 to improve the brightness of the display panel 100. For example, when the pixel units 110 of the display panel 100 respectively emit red light, green light and blue light, since the light emitted by a light-emitting device 50 of a certain blue pixel unit 110 is blue, color resist units 71 of corresponding colors can be arranged only in the excitation cavities 60 corresponding to the red and green pixel units 110, while a color resist unit 71 of a blue color is not arranged in the excitation cavities 60 corresponding to the blue pixel. The display of the blue color can be enhanced, so as to balance the poor sensitivity of a person to the blue color, thereby improving the display quality of the display panel 100.

Further, with further reference to FIG. 14, the color resist units 71 include scattering particles. When the scattering particles are added to the color resist units 71, the color resist units 71 can not only filter out the heterochromatic light, but also scatter the light, so that the thickness of the display panel 100 is reduced while the display panel 100 can have a larger viewing angle.

Figure 15:
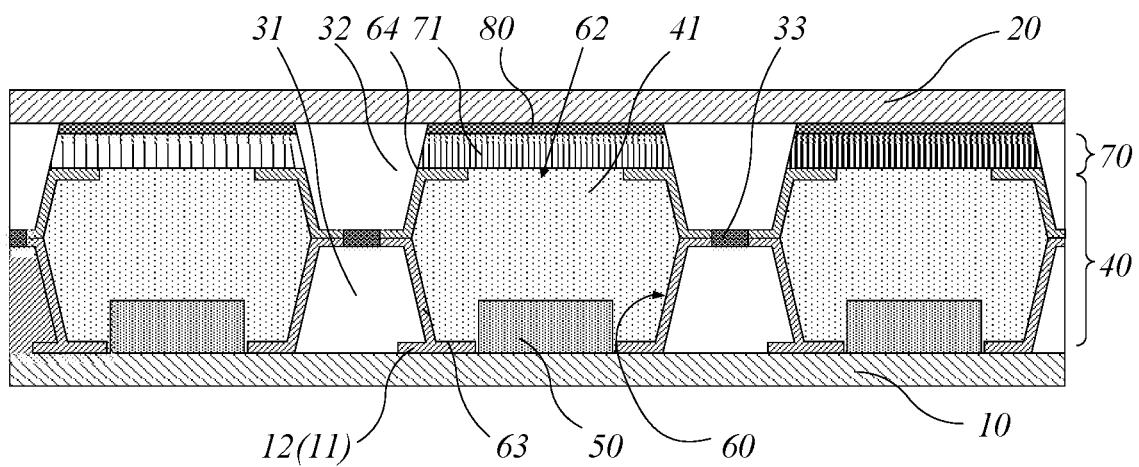
FIG. 15 is a cross-sectional view of a section A-A shown in FIG. 2 of another display panel according to an embodiment of the present application.

FIG. 15 is a cross-sectional view of a section A-A shown in FIG. 2 of another display panel according to an embodiment of the present application.

Further, with reference to FIG. 15, the display panel 100 according to the embodiments of the present application further includes a scattering layer 80 on a side of the second substrate 20 facing the first substrate 10. At least a part of the scattering layer 80 is positioned between the color resist units 71 and the second substrate 20. Light emitted by the excited quantum dots 41 is reflected in the excitation cavities 60, and is emitted outside from the light outlets 62 at a small scattering angle. The scattering layer 80 is capable of scattering light emitted outside from the light outlets 62, so that the light can have a large scattering angle, thereby allowing the display panel 100 to have a large viewing angle range.

Figure 16:
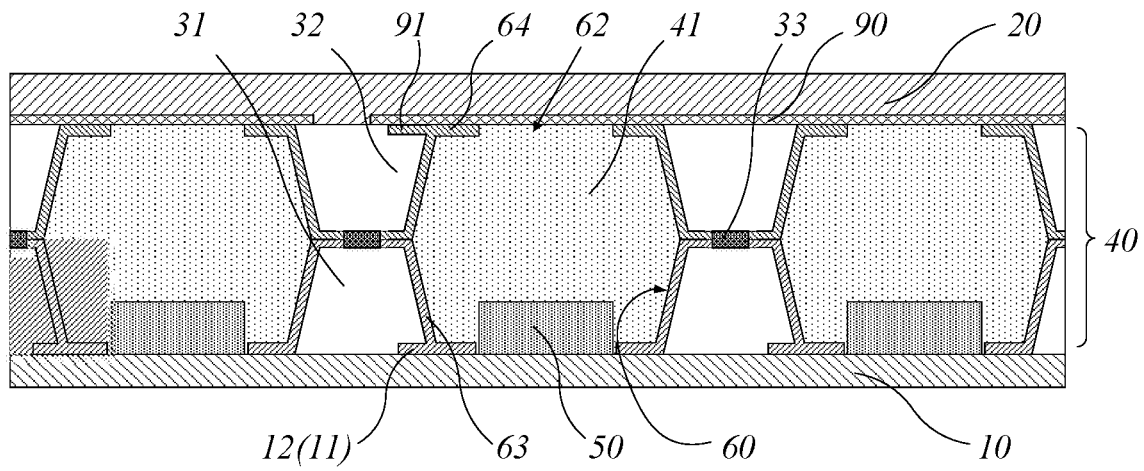
FIG. 16 is a cross-sectional view of a section A-A shown in FIG. 2 of another display panel according to an embodiment of the present application.

FIG. 16 is a cross-sectional view of a section A-A shown in FIG. 2 of another display panel according to an embodiment of the present application.

Further, with reference to FIG. 16, the display panel 100 of the embodiments of the present application further includes: a touch layer 90, at least a part of the touch layer 90 being positioned on a side of the isolation structure 30 facing away from the first substrate 10; a touch signal line 91 electrically connected to the touch layer, the touch signal line 91 being positioned between the touch layer 90 and the first substrate 10. At least a part of the first reflection portion 63 or at least a part of the second reflection portion 64 is reused as at least a part of the touch signal line 91. The first reflection portion 63 and the second reflection portion 64 are insulated from each other. When the display panel 100 is a touch display panel 100, the touch panel is arranged in the display panel 100 in an embedded manner.

The touch layer 90 includes touch electrodes for generating capacitance to detect the positioned being touched. The touch layer 90 is positioned on a side of the isolation structure 30 facing away from the first substrate 10, so that the second substrate 20 can also protect the touch layer 90. The touch layer 90 is generally made of a transparent indium tin oxide (ITO) material, so as to reduce the influence on display. The touch signal line 91 is electrically connected to the touch electrodes of the touch layer 90 for transmitting a change in capacitance in the form of an electrical signal. When a user performs touch control by touching the display panel 100, a finger touches the display panel 100. Since a human body is a conductor, a capacitance is formed between the human body and a touch electrode of the touch layer 90. The change in capacitance is induced in the form of an electrical signal through the touch signal line 91. By detecting the signal from the touch signal line 91, the position of the touch electrode forming the capacitance with the finger can be determined to reflect the position where the finger touches the display panel 100. The corresponding relationship between the touch electrode and the pixel unit 110 of the display panel 100 is not limited, and one touch electrode may correspond to a plurality of pixel units 110.

In consideration of the reflection characteristics of the second reflection portion 64, the second reflection portion 64 may be made of a metal material. When the second reflection portion 64 is made of a metal material, the second reflection portion 64 can be reused with the touch signal line 91, so as to simplify the complexity of the wiring design of the touch signal line 91 and reduce the thickness of the display panel 100. The insulation between the first reflection portion 63 and the second reflection portion 64 can prevent the first reflection portion 63 from causing the touch signal line 91 reused with the second reflection portion 64 to be short-circuited.

Further, with further reference to FIG. 16, an insulation structure 33 is arranged at the junction of the first protrusion 31 and the second protrusion 32. The insulation structure 33 penetrates through the second reflection portion 64 in the thickness direction of the display panel 100. The insulation structure 33 surrounds the excitation cavities 60. At least a part of the second reflection portion 64 is positioned in a region surrounded by the insulation structure 33. The part of the second reflection portion 64 positioned in the region surrounded by the insulation structure 33 is reused as a part of the touch signal line 91. The isolation structure 30 extends in the plane of the display panel 100, and the excitation cavities 60 are equivalent to structures penetrating through the isolation structure 30. Therefore, the first reflection portion 63 and the second reflection portion 64 also extend in the plane of the display panel 100. When the second reflection portion 64 is reused as the touch signal line 91, the insulation structure 33 can prevent the second reflection portion 64 from causing a short circuit between adjacent touch signal lines 91. The insulation structure 33 is arranged at the junction of the first protrusion 31 and the second protrusion 32, so that the insulation structure 33 does not destroy the reflection functions of the first reflection portion 63 and the second reflection portion 64 in the single excitation cavities 60.

Figure 17:
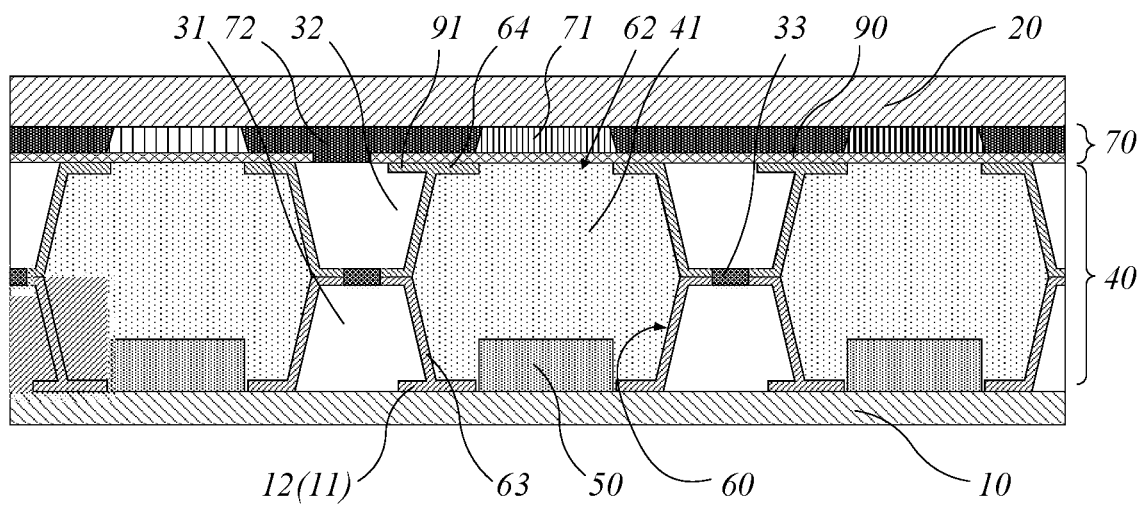
FIG. 17 is a cross-sectional view of a section A-A shown in FIG. 2 of another display panel according to an embodiment of the present application.

FIG. 17 is a cross-sectional view of a section A-A shown in FIG. 2 of another display panel according to an embodiment of the present application.

Further, with reference to FIG. 17, the display panel 100 of the embodiment of the present application further includes a color resist layer 70 positioned between the touch layer 90 and the second substrate 20. The color resist layer 70 includes a plurality of color resist units 71 and a black matrix 72 surrounding the color resist units 71. An orthographic projection of each of the light outlets 62 on the second substrate 20 at least partially overlaps with an orthographic projection of one of the color resist unit 71 on the second substrate 20. The color resist units 71 are in one-to-one correspondence with the quantum dots 41. A color of the excitation light of a quantum dot 41 is the same as a color of the corresponding color resist unit 71. A small amount of the light emitted by the light-emitting devices 50 that is emitted outside directly from the light outlets 62 without exciting the quantum dots 41 to emit light can be filtered out by the color resist units 71. Thus, crosstalk of the light emitted by the light-emitting devices 50 to the excitation light of the quantum dots 41 is further reduced, so that the color purity of the light emitted outside from the light outlets 62 is higher. In addition, the blue light or ultraviolet light emitted by the light-emitting devices 50 can be filtered out by the color resist units 71 to reduce the damage to the user's eyes by the blue light or ultraviolet light. The black matrix 72 is made of a light shielding material to prevent light emitted outside from one color resist unit 71 from causing crosstalk to light emitted outside from an adjacent color resist unit 71.

In summary, the embodiments of the present application provide a display panel. The excitation cavities surrounding the light-emitting devices are formed by the isolation structure, and the inner walls of the excitation cavities are provided with the reflection portion, so that light emitted by the light-emitting devices can be reflected in the excitation cavities and used to excite the quantum dots to emit light, and the light emitted by the excited quantum dots will also be reflected in the excitation cavities and be emitted outside from the light outlets and used for display. Crosstalk between light of different colors is avoided, thereby improving the color purity of the emitted light, making the display image of the display panel more realistic and improving the display quality of the display panel.

Although the preferred embodiments of the present application have been disclosed for illustrative purposes, those skilled in the art will appreciate that various modifications, additions and substitutions are possible, without departing from the scope and gist of the application as disclosed in the accompanying claims. Therefore, the scope of protection of this application should be determined with reference to the claims.

What is claimed is:

1. A display panel comprising:
a first substrate and a second substrate, and an isolation structure and a plurality of light-emitting devices between the first substrate and the second substrate, the second substrate and the first substrate being both connected to the isolation structure, the first substrate, the isolation structure and the second substrate forming a plurality of excitation cavities, and each the light-emitting devices being positioned in one of the excitation cavities;
a quantum dot layer comprising quantum dots, positioned in the excitation cavities and on a side of the light-emitting devices facing away from the first substrate;
wherein sidewalls of the excitation cavities are provided with a reflection portion, at least a part of the reflection portion covers at least a part of the first substrate and at least a part of the second substrate, and light outlets are positioned on a side of the reflection portion close to the second substrate.

2. The display panel according to claim 1, wherein the excitation cavities are in one-to-one correspondence with the light-emitting devices.

3. The display panel according to claim 1, wherein the isolation structure is arranged on the first substrate and extends toward the second substrate; or, the isolation structure is arranged on the second substrate and extends toward the first substrate.

4. The display panel according to claim 1, wherein the isolation structure comprises:
a first protrusion on the first substrate; and
a second protrusion on the second substrate;
wherein in a direction perpendicular to the first substrate, a projection of the first protrusion and a projection of the second protrusion at least partially overlap.

5. The display panel according to claim 4, wherein in a thickness direction of the display panel, a ratio of a height of the first protrusion to a height of the second protrusion is greater than or equal to 1:2, and less than or equal to 2:1.

6. The display panel according to claim 4, wherein the first protrusion has a gradually decreasing cross-sectional area in a direction from the first substrate to the second substrate; and the second protrusion has a gradually decreasing cross-sectional area in a direction from the second substrate to the first substrate.

7. The display panel according to claim 6, wherein each of the light-emitting devices comprises an out-light surface, and a junction of the first projection and the second projection is coplanar with the out-light surface.

8. The display panel according to claim 4, wherein a volume of each of the light-emitting devices is less than or equal to ⅔ of a volume of one of the excitation cavities corresponding to the light-emitting device.

9. The display panel according to claim 8, wherein in the thickness direction of the display panel, a height of the light-emitting device is less than or equal to ⅔ of a height of the excitation cavity.

10. The display panel according to claim 4, wherein the reflection portion comprises:
a first reflection portion on a side of the first protrusion facing away from the first substrate, at least a part of the first reflection portion covering the first protrusion, and at least a part of the first reflection portion covering at least a part of the first substrate;

a second reflection portion on a side of the second protrusion facing away from the second substrate, at least a part of the second reflection portion covering the second protrusion, and at least a part of the second reflection portion covering at least a part of the second substrate.

11. The display panel according to claim 10, wherein the first substrate comprises a first metal layer between the light-emitting devices and the first substrate, and at least a part of the first reflection portion is co-layered with the first metal layer.

12. The display panel according to claim 11, wherein the first metal layer comprises a signal line, at least a part of the first reflection portion is reused as the signal line, and the first reflection portion and the second reflection portion are insulated from each other.

13. The display panel according to claim 12, wherein an insulation structure is arranged at a junction of the first protrusion and the second protrusion, the insulation structure penetrates through the first reflection portion and the second reflection portion in a thickness direction of the display panel, the insulation structure surrounds the excitation cavities, at least a part of the first reflection portion and at least a part of the second reflection portion are in a region surrounded by the insulation structure, and the part of the first reflection portion in the region surrounded by the insulation structure is reused as a part of the signal line.

14. The display panel according to claim 10, further comprising:
a touch layer, at least a part of the touch layer being on a side of the isolation structure facing away from the first substrate;
a touch signal line electrically connected to the touch layer and positioned between the touch layer and the first substrate, at least a part of the first reflection portion or at least a part of the second reflection portion being reused as at least a part of the touch signal line, and the first reflection portion and the second reflection portion being insulated from each other.

15. The display panel according to claim 14, wherein an insulation structure is arranged at a junction of the first protrusion and the second protrusion, the insulation structure penetrates through the second reflection portion in a thickness direction of the display panel, the insulation structure surrounds the excitation cavities, at least a part of the second reflection portion is in a region surrounded by the insulation structure, and the part of the second reflection portion in the region surrounded by the insulation structure is reused as a part of the touch signal line.

16. The display panel according to claim 14, further comprising:
a color resist layer between the touch layer and the second substrate, the color resist layer comprising a plurality of color resist units and a black matrix surrounding the color resist units, an orthographic projection of each of the light outlets on the second substrate at least partially overlapping with an orthographic projection of one of the color resist units on the second substrate, the color resist units being in one-to-one correspondence with the quantum dots, and a color of excitation light of each of the quantum dots being the same as a color of a color resist unit corresponding to the quantum dot.

17. The display panel according to claim 1, further comprising:
a scattering layer on a side of the second substrate facing the first substrate, at least a part of the scattering layer covering the light outlets.

18. The display panel according to claim 1, further comprising:
a color resist layer on a side of the second substrate facing the first substrate, the color resist layer comprising a plurality of color resist units, each of the color resist units covering one of the light outlets, the color resist units being in one-to-one correspondence with the quantum dots, and a color of excitation light of each of the quantum dots being the same as a color of a color resist unit corresponding to the quantum dot.

19. The display panel according to claim 18, wherein the color resist units are between the reflection portion and the second substrate.

20. A display apparatus comprising a display panel comprising:
a first substrate and a second substrate, and an isolation structure and a plurality of light-emitting devices between the first substrate and the second substrate, the second substrate and the first substrate being both connected to the isolation structure, the first substrate, the isolation structure and the second substrate forming a plurality of excitation cavities, and each the light-emitting devices being positioned in one of the excitation cavities;
a quantum dot layer comprising quantum dots, positioned in the excitation cavities and on a side of the light-emitting devices facing away from the first substrate;
wherein sidewalls of the excitation cavities are provided with a reflection portion, at least a part of the reflection portion covers at least a part of the first substrate and at least a part of the second substrate, and light outlets are positioned on a side of the reflection portion close to the second substrate.

* * * * *